United States Patent [19]

Kato

[11] Patent Number: 5,395,255
[45] Date of Patent: Mar. 7, 1995

[54] IC SOCKET

[75] Inventor: Yuji Kato, Yokohama, Japan

[73] Assignee: Yamaichi Electric Co., Ltd., Tokyo, Japan

[21] Appl. No.: 265,619

[22] Filed: Jun. 24, 1994

Related U.S. Application Data

[63] Continuation of Ser. No. 942,824, Sep. 10, 1992, abandoned.

[30] Foreign Application Priority Data

Sep. 13, 1991 [JP] Japan .................. 3-262951

[51] Int. Cl.⁶ .............................................. H05K 1/00
[52] U.S. Cl. ...................................... 439/72; 439/330; 439/525
[58] Field of Search ..................... 439/68, 69, 70, 71, 439/72, 73, 330, 331, 525, 526

[56] References Cited

U.S. PATENT DOCUMENTS

| | | | |
|---|---|---|---|
| 4,846,703 | 7/1989 | Matsuoka et al. | 439/330 |
| 4,887,969 | 12/1989 | Abe | 439/331 |
| 4,984,991 | 1/1991 | Nishimoto | 439/72 |
| 5,100,332 | 3/1992 | Egawa | 439/72 |

*Primary Examiner*—Larry I. Schwartz
*Assistant Examiner*—Hien D. Vu
*Attorney, Agent, or Firm*—Wenderoth, Lind & Ponack

[57] ABSTRACT

An IC socket includes a socket board having a plurality of contacts, and an IC platform vertically movably disposed on the socket board and adapted to support thereon an IC having a plurality of leads projecting sidewards from a body thereof so as to be contacted with the contacts. Inclined wall surfaces are formed at both ends of a row of the contacts and are adapted to guide the leads onto vertical wall surfaces formed at lower ends of the inclined wall surfaces. To this end, the contacts at the ends of the row are guided onto the vertical wall surfaces by the inclined wall surfaces when the IC platform with the IC body supported thereon is lowered, so that the leads are brought into contact with the contacts. The IC socket further includes a plurality of projections formed on an upper surface of the IC platform and adapted to support a lower surface of the IC body such that the lower surface of the IC body floats above the upper surface of the IC platform, such that the leads are not supported on a marginal wall projecting upwardly from a marginal portion of the IC platform, and such that a ventilation space or gap is formed between the lower surface of the IC body and the upper surface of the IC platform.

6 Claims, 5 Drawing Sheets

IC SOCKET

This application is a continuation of now abandoned application, Ser. No. 07/942,824, filed on Sep. 10, 1992.

BACKGROUND OF THE INVENTION

1. Field of the Invention

This invention relates to an IC socket having an IC platform capable of moving upwardly and downwardly, the platform with an IC body supported thereon being moved downwardly so as to bring leads projecting sidewardly of the IC body into contact with contacts arranged on a socket board.

2. Prior Art

In a conventional IC socket in which an IC platform supported by a socket body is resiliently carried and held in an upper position by a spring, an IC body is placed on the IC platform when the platform is held in the upper position, and the IC leads are then pushed down into a lower position from the upper position against the bias of the spring by a presser cover attached to the socket board, or a jig, so that the IC leads are brought into contact with contacts arranged on the socket board, a lower surface of the IC body is supported on an upper surface of the IC platform in order to bring the IC leads into contact with the contacts projecting sidewardly (outwardly) of the IC platform beyond a marginal wall thereof. Alternatively, the IC leads are allowed to project sidewardly with basal portions thereof supported on the marginal wall, and the lower surface of the IC body is floated above the upper surface of the IC table in order to realize a non-supported state.

On the other hand, the socket board includes a plurality of contacts to be contacted with the IC leads. Inclined wall surfaces are formed on both ends of a row of these contacts, and vertical wall surfaces are formed continuously from lower ends of these inclined wall surfaces. The reason for the foregoing arrangement is that as the IC platform with the IC body supported thereon is lowered, the IC leads at both ends of the row are guided by the inclined wall surfaces into a space between the vertical wall surfaces in order to regulate the IC leads at the ends of the row so that the leads are correctly aligned with the contacts.

Conventionally, the IC leads are frequently not in alignment with the contacts when the IC is placed on the IC platform. In the conventional manner, the IC leads are pushed down with the IC presser cover or jig, and the IC leads at the ends of the row are moved downwardly and in a horizontal direction along the inclined wall surfaces and into the space between the vertical wall surfaces so that the IC leads are correctly aligned with the contacts.

In the conventional plug-in type IC socket, it is necessary to correctly position the IC leads by applying correcting force thereto after the IC is placed on the IC platform. However, in both the example where the lower surface of the IC is supported on the upper surface of the IC platform and the example where the leads are supported on the marginal wall of the IC platform, there is a large amount of frictional resistance between the IC and the IC platform or between the IC and the marginal wall. As a result, the IC leads are not correctly introduced into the space between the vertical wall surfaces from the inclined wall surfaces, and when the IC leads are urged against the contacts with a presser means, excessive force is applied to the IC leads at the ends of the row, with the result that the IC leads are deformed and/or the IC leads cannot be correctly aligned with the contacts.

In recent years, there is a tendency to make IC leads smaller and smaller and thus more fragile. It is difficult, therefore, to move the comparatively heavy IC body against the frictional force by applying the correcting force to the leads, and such attempts often cause the leads to be deformed.

SUMMARY OF THE INVENTION

It is therefore an object of the present invention to provide a plug-in type IC socket including an IC platform, in which when leads of an IC placed on the platform are corrected in position by inclined wall surfaces, the leads are effectively prevented from being deformed, and in which the IC can be cooled satisfactorily.

In order to achieve the above object, there is essentially provided an IC socket comprising a socket board having a plurality of contacts, and an IC platform vertically movably disposed on the socket board and adapted to support thereon an IC having a plurality of leads projecting sidewards (outwardly) from a body thereof so as to be contacted with the contacts. Inclined wall surfaces are formed at both ends of a row of the contacts and adapted to guide the leads onto vertical wall surfaces formed at lower ends of the inclined wall surfaces. Contacts at both ends of the row are guided onto the vertical wall surfaces by the inclined wall surfaces when the IC platform with the IC body supported thereon is lowered, so that the leads are into contact with the contacts. The IC socket further comprises a plurality of projections formed on an upper surface of the IC platform and adapted to support a lower surface of the IC body such that the lower surface of the IC body floats above the upper surface of the IC platform, such that the leads are not supported on a marginal wall projecting upwardly from a marginal portion of the IC platform, and such that a ventilation space or gap is formed between the lower surface of the IC body and the upper surface of the IC platform. The projections may be arranged such that they support an intermediate portion of each side of the IC body so that fine adjustments can be obtained more easily.

As mentioned above, the IC body is supported by the projections formed on the upper surface of the IC platform in a floating fashion. In addition, the IC leads are not supported on the marginal wall of the IC platform and are freely projected sidewards (outwardly) so as to be contacted with the contacts. Accordingly, the IC body can easily slip along the surfaces of the projections. Therefore, when the correcting force is applied to the IC leads by the inclined wall surfaces, the IC body is comparatively easily slid on the surfaces of the projections to guide the leads from the inclined wall surfaces to a space between the vertical wall surfaces, so that the IC leads and the contacts are correctly aligned with each other. In addition, the IC lead at the end of the row can be effectively prevented from having excessive force applied thereto by the contact with the inclined wall surface, thus enabling the problem of deformation of the IC leads to be efficiently solved.

Furthermore, since the bottom surface of the IC body is floatingly supported on the upper surface of the IC platform through the projections, and since the IC leads are not in contact with the marginal wall, heating of the IC can be effectively cooled by air and/or the heat generated from the IC can be effectively released.

DETAILED DESCRIPTION OF THE EMBODIMENT

Figure 1:
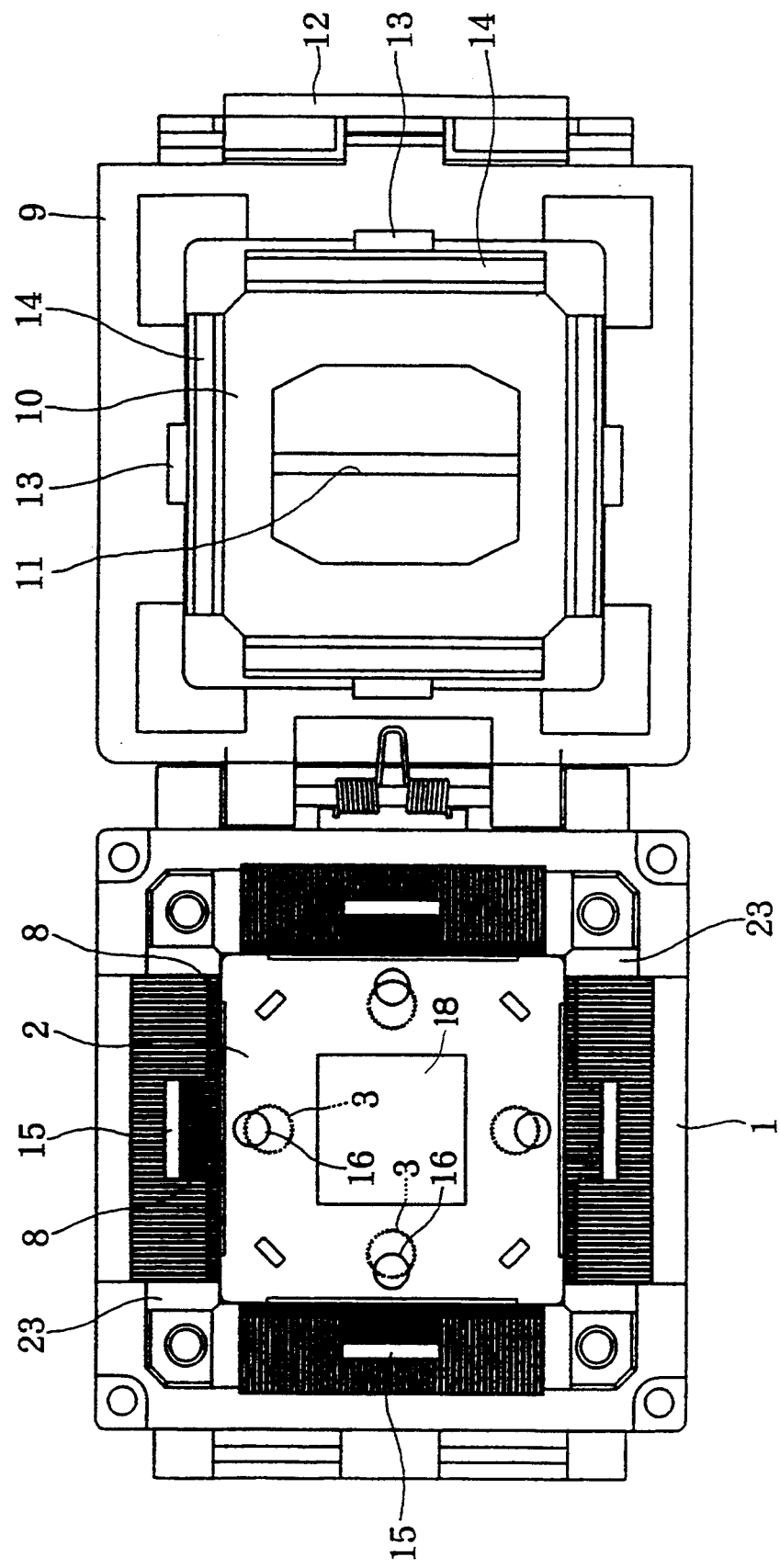
FIG. 1 is a plan view of an IC socket according to one embodiment of the present invention.

One embodiment of the present invention will now be described in detail with reference to FIGS. 1 through 8 inclusive.

The numeral 1 denotes a board of insulating material which forms an IC socket body (or socket board). Disposed at a generally central portion of the socket board 1 is a generally rectangular IC platform 2 which is resiliently supported by a spring 3 such that the platform 2 can be moved from an upper position to a lower position against the force of the spring 3 and from the lower position to the upper position in compliance with the force of the spring 3. When the IC platform 2 is held in the upper position, an IC body 4 is placed thereon, and when the IC platform 2 is held in the lower position, the socket board and the IC body (or IC) are pressed into contact against one another.

As contacting means, the IC has a plurality of leads 5 projecting sideward from either two sides or four sides of the IC body 4. On the other hand, the socket board 1 has a number of contacts 6 corresponding to the number of IC leads 5. The contacts 6 are arranged in rows along either two peripheral sides or four peripheral sides of the IC platform 2. Contact nose portions 7 formed at free ends of vertically elastically shiftable elastic contacting elements of the contacts 6 are correctly positioned by being interposed between partition walls 8 arranged in a spaced apart manner along marginal areas of the IC platform 2.

When the IC platform 2 is lowered (pressed downwardly), the IC leads 5 are pressed into contact against the contact nose portions 7, respectively. As a pressing means (i.e. a means for pressing the IC platform downwardly), a basal end of an IC presser cover 9 is pivotably supported on one end of the socket board 1 such that when the presser cover 9 is closed onto the socket board 1, the IC platform 2 is pushed down by a first presser portion 13 of a presser member 10 which is pivotably mounted at an inner surface of the cover 9 by a pin 11, and after a slight time interval, the IC leads 5 are pushed down by a second presser portion 14 of the presser member 10 to flex the elastic contacting elements of the contacts, so that a contacting pressure is created between the IC leads 5 and the contact nose portions 7 due to the elastic reaction force of the contacts 6.

The contact relation can be maintained by bringing a lock member 12 disposed at a free end of the presser cover 9 into engagement with one end portion of the socket board 1. The presser member 10 has a generally rectangular shape of a dimension generally corresponding to that of the platform 2. The second presser portions 14 are railroad tie-like members and extend in parallel to the rows of the IC leads, respectively, by being integrally mounted on either two sides or four sides of the marginal portions of the presser member 10. The first presser portions 13 are integrally connected to the outer sides of the second presser portions 14, respectively.

As shown in FIG. 1, the partition walls are formed in rows (four rows are shown in FIG. 1, but only two rows are required when there are only two rows of IC leads 5 and contacts 6). For each row of the partition walls 8, or portion of the partition walls 8 are connected at, for example, central portions thereof in order to form a pressure bearing portion 15. This pressure bearing portion 15 is arranged in such a manner as to correspond to (i.e. be aligned with) the first presser portion 13. Therefore, the first presser portion 13 is disposed at a central portion of the second presser portion 14, as also shown in FIG. 1.

When the presser cover 9 is closed on the socket board 2, first, the first presser portions 13 effect a primary pressing function by pushing down the pressure bearing portions 15 to push down the IC platform 2. Due to the lowering movement of the IC platform 2, the IC leads 5 are brought into contact with the contact nose portions 7 of the contact 6. Then, a secondary pressing function is effected by the second presser portions 14 to flex the elastic contacting elements of the contacts 6 to obtain the contact pressure (see FIGS. 5 and 6).

The presser member 10 and the presser cover 9 may be of an integral construction instead being formed as separate parts. In other words, the first and second presser portions 13 and 14 can be integral with the presser cover 9.

In the above exemplified IC socket, a plurality of projections 16 are formed on the upper surface of the IC platform 2 in order to support the lower surface of the IC body 4 such that the lower surface of the IC body 4 is supported above the upper surface of the platform 2. Although not shown in the drawings, a number, four for example, of the projections 16 can be provided in order to support, for example, the lower surfaces of the corner portions of the IC body 4. As another preferred example, and as shown in the drawings, four of the projections 16 can be provided in order to support the IC body 4 at intermediate portions thereof (see FIG. 1). The springs 3 are disposed generally right under the projections 16, respectively, in order to support the IC platform 2 in a well balanced manner.

Figure 3:
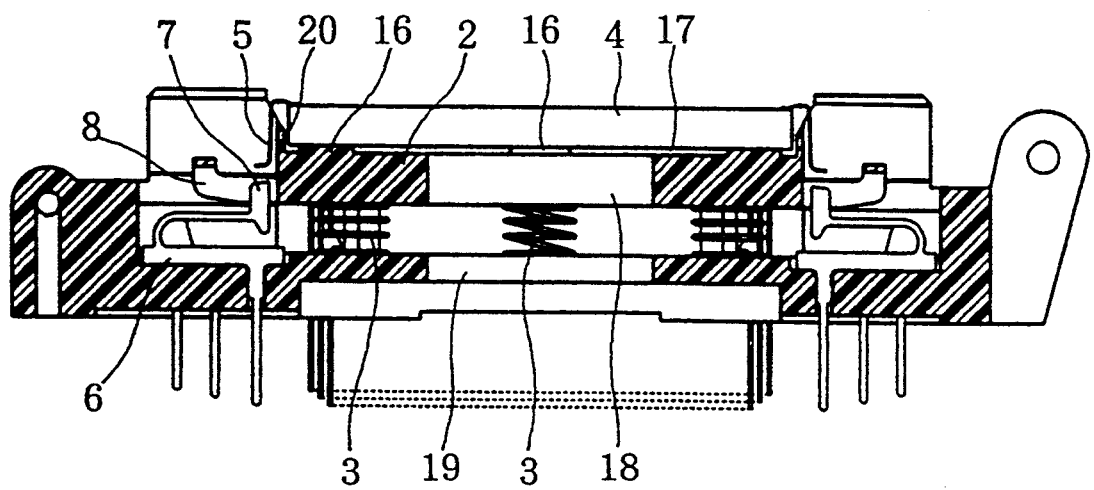
FIG. 3 is a sectional view of the IC socket but with an IC inserted therein.

By supporting the IC body 4 on the projections 16, a ventilation space or gap 17 is formed between the lower surface of the IC body 4 and the upper surface of the IC platform 2, and the ventilation gap 17 is communicated with a ventilation window 18 formed through a central portion of the IC platform 2 (see FIGS. 1 and 3). Furthermore, another ventilation window 19 is formed in the socket board 1 in a position right under the center ventilation window 18 of the platform 2. Both of the ventilation windows 18 and 19 are communicated with the ventilation gap 17. The IC platform 2 is provided with a marginal wall 20 upstanding from a marginal area thereof so that the peripheral surface of the IC body 4 is surrounded by the marginal wall 20. The IC body 4 is received in a space defined by the marginal wall 20 such that the lower surface of the IC body 4 is supported on the projections 16. As shown in FIGS. 3–6, the projections 16 are spaced inwardly from the marginal wall 20. This inward positioning of the projections 16, together with the fact that the projections 16 are spaced apart from one another (see FIG. 1), results in their being communication between the gap 17 and a space formed between the IC body 4 and the marginal wall 20 (see FIGS. 3–5).

The IC body 4, which is supported by the projections 16, can be slid in the lateral direction by only a very small distance. In other words, the marginal wall 20 permits the IC body 4 to slide only slightly in the lateral direction, thereby enabling the position of the IC leads 5 to be corrected, as will be described hereinafter.

The plurality of IC leads 5 project sideward from the marginal area of the IC body and also extend downwardly along a side surface of the IC body 4. A lower end of each IC lead 5 is bent sideward (outwardly) at a generally right angle to form a contacting portion (see FIGS. 3 and 4).

Figure 2:
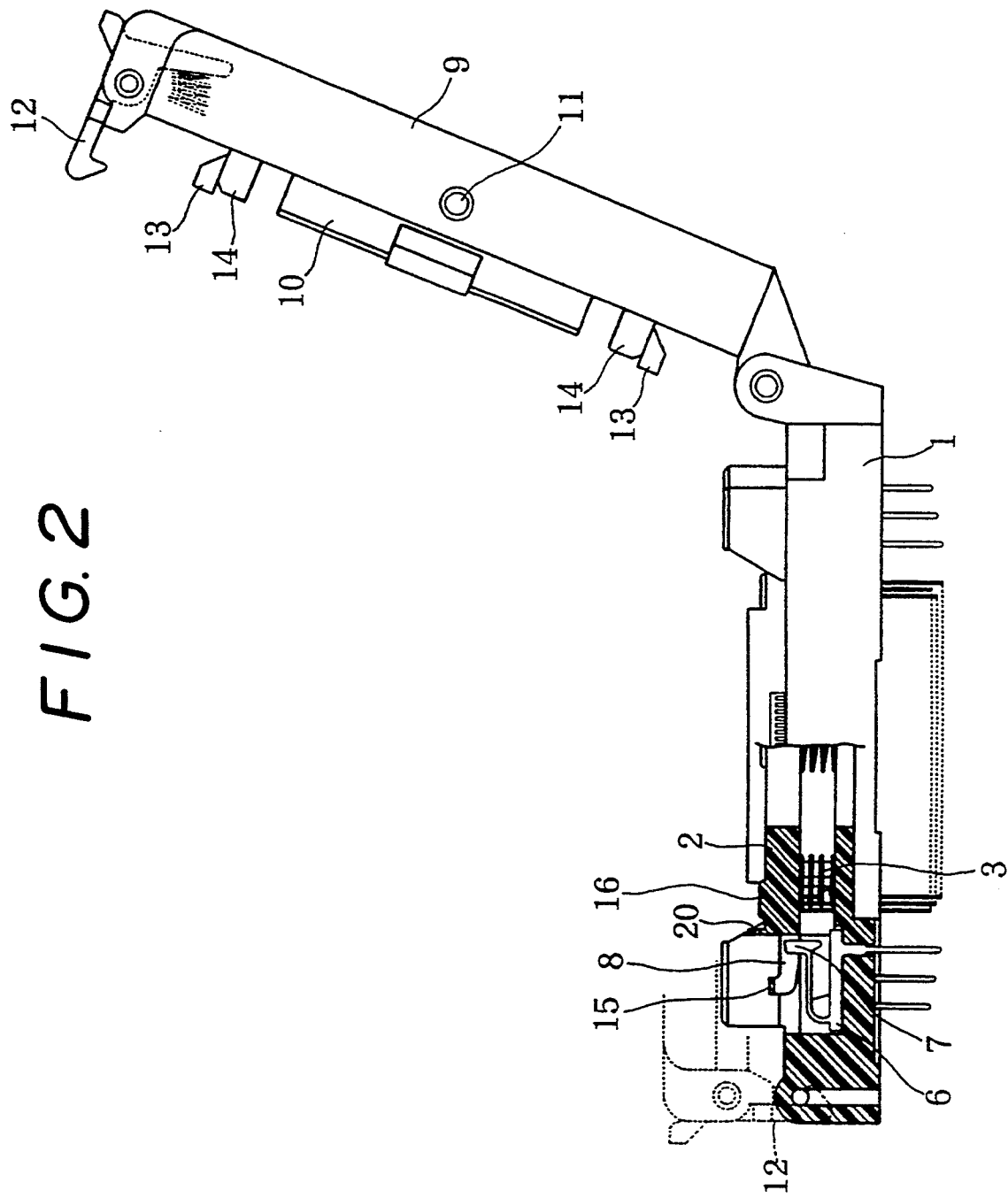
FIG. 2 is a side view, partly in section, of the IC socket.
Figure 4:
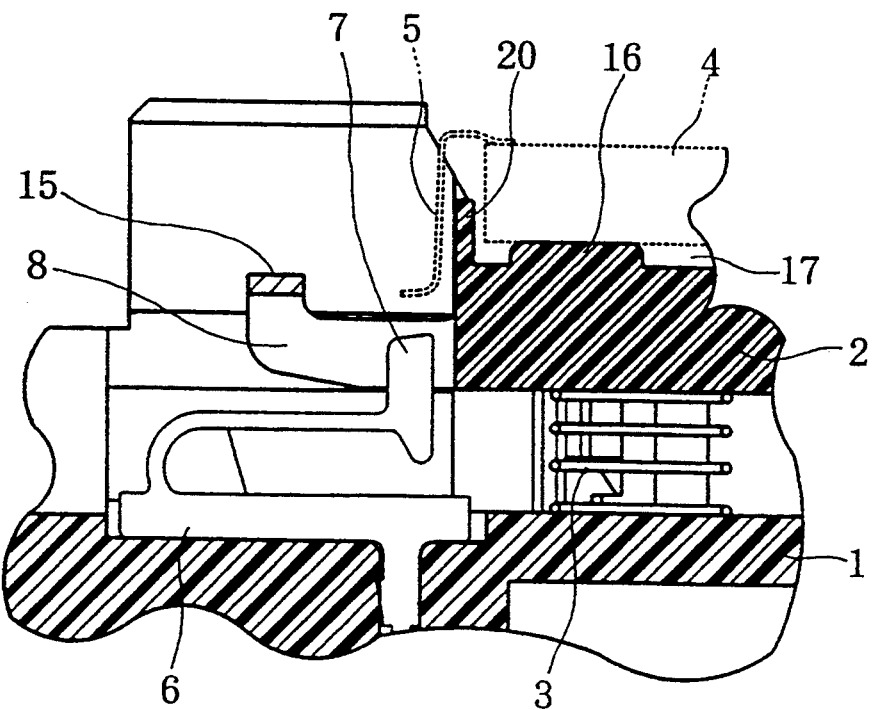
FIG. 4 is a partly enlarged sectional view of FIG. 3.

As shown in FIG. 2, when the IC platform 2 is pushed up and held in the upper position by the spring 3, the IC is placed on the platform 2 and the IC body 4 is supported on the projections 16. As shown in FIGS. 3 and 4, when the IC body 4 is supported on the projections 16, each of the IC leads 5 extends over the marginal wall 20 and is directed downwardly along one side surface of the IC platform 2, the contacting portion formed at the lower end 9f each lead 5 is held spaced apart from and opposite the contact nose portion 7 of the contact 6, and each of the IC leads 5 is not supported on the marginal wall 20. In other words, only the weight of the IC body 4 is supported by the projections 16. Although the side edge of the IC body 4 sometimes contacts a part of the marginal wall 20, the sliding resistance of the IC body 4 is generally limited to the sliding resistance between the IC body 4 and the projections 16.

As described above, the IC body 4, which is supported on the projections 16, can be slid in the lateral direction only by a very limited distance under the restriction of the marginal wall 20, thereby enabling correction of the position of each IC lead 5.

Figure 7:
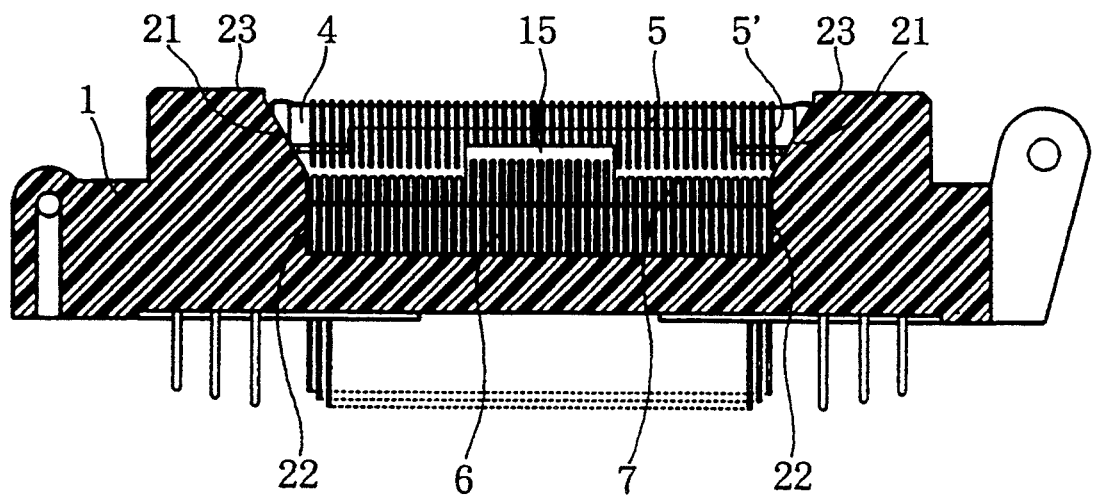
FIG. 7 is a sectional view of the IC socket, but with the IC lead at one end of the row being corrected in position by the inclined wall surfaces when the IC platform is pushed down by the first presser portion.
Figure 8:
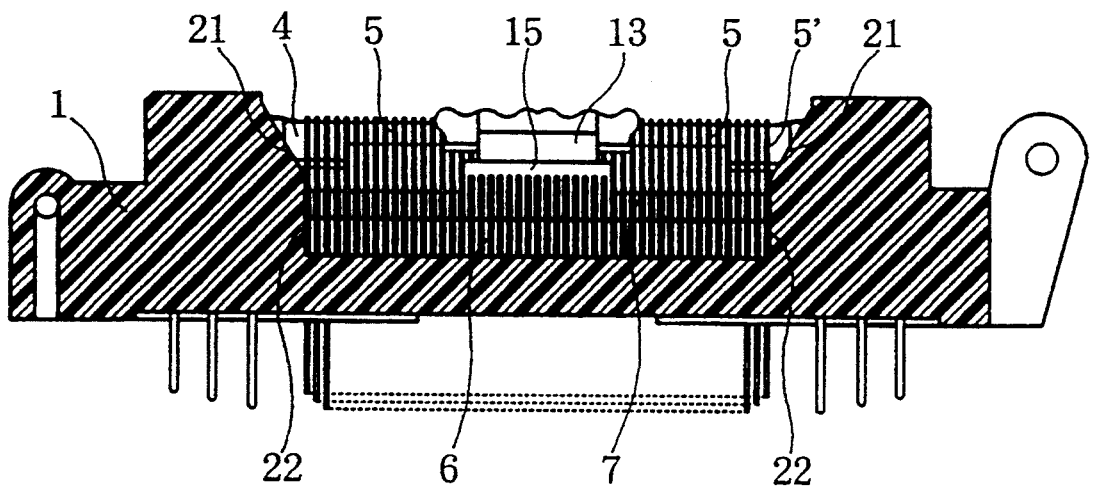
FIG. 8 is a sectional view of the IC socket, but with the IC leads pushed down by the second presser portion into a position between the vertical wall surfaces.

As means for correcting the positions of the IC leads 5, as shown in FIGS. 7 and 8, inclined wall surfaces 21 for guiding the IC leads 5 are formed at both ends of each row of contacts 6, and vertical wall surfaces 22 are formed at lower ends of the inclined wall surfaces 21, respectively. For this purpose, a guide block 23 is formed at the end of each row of the contacts 6 in such a manner as to be integral with the socket board 1, and the inclined wall surface 21 and the vertical wall surface 22 are formed on the side surface of the guide block 23 which corresponds in position to the lead at one end of the row of the guide blocks 23, the inclined wall surface being in a position higher than the contact nose portions 7 of the contacts 6, and the contact nose portions 7 being located between the vertical wall surfaces 22.

The inclined wall surface 21 serves as a means for guiding the IC leads at the end of the row between the vertical wall surfaces 22 so that they are in alignment with the contact nose portions 7 of the contacts 6 which are arranged between the vertical wall surfaces 22. Therefore, the inclined wall surface 21 is oriented such that the distance is gradually narrowed as it goes downward (toward the vertical wall surface 22).

Figure 5:
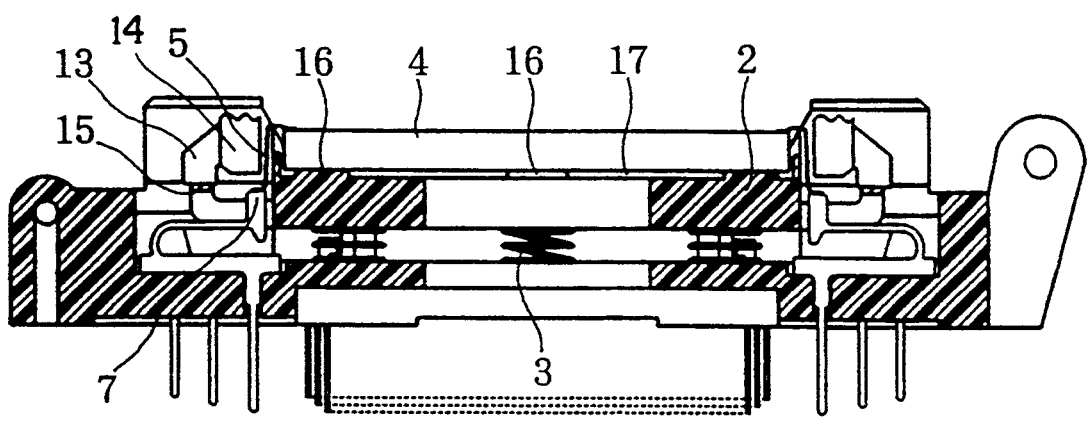
FIG. 5 is a sectional view of the IC socket with the IC inserted therein as shown in FIG. 3, but with a presser cover closed and with the IC platform pushed down by a first presser portion.

As shown in FIG. 3, when the presser cover 9 is closed under the conditions that the IC is placed on the IC platform 2 and the IC body 4 is supported on the projections 16, the pressure bearing portions 15 are pushed down by the first presser portion 13 to lower the IC platform 2 as already described. As a result, the contacting portions of the IC leads 5 are brought into contact with the contact nose portions 7 of the contacts 6, respectively as shown in FIG. 5.

To exemplify this position correction, referring to FIG. 7, when the IC leads 5 and the contact nose portions 7 are not in alignment with each other, the IC lead at one end of the row (designated as IC lead 5' in FIGS. 7 and 8) is abutted against and guided by the inclined wall surface 21 as the IC platform 2 is lowered and is thereby introduced between the vertical wall surfaces 22 as shown in FIG. 8. In this manner, the IC leads 5 and the contacts 6 are placed in a one-by-one corresponding relationship with one another. It is to be noted that when one of the IC leads 5 (e.g. lead 5') slides down the inclined wall surface 21 so as to be corrected in position, the second presser portion 14 is not in contact with the lead 5 and exerts no load against the lead 5. As a result, the IC body 4 can slide on the surfaces of the projections 16 comparatively smoothly, and therefore the IC lead 5' at one end of the row can slide down the inclined wall surface 21 comparatively smoothly and is then introduced to the vertical wall surface 22 without exerting excessive force thereagainst.

After the IC leads 5 are brought into contact with the corresponding contacts 6, respectively, the IC platform 2 is continuously lowered by the first presser portion 13, and then the second presser portion 14 begins to push down the contacting portions of the IC leads 5. In this manner, the contact nose portions 7 of the contacts 6 are pushed down so as to be elastically deformed downwardly, and contact pressure between the IC leads 5 and the contacts 6 can be obtained by reaction thereof. It is noted again that after the first presser portion 13 begins to push down the pressure bearing portion 15, there is a slight time interval before the second presser portion 14 pushes down the IC leads 5 which are in contact with the corresponding contacts 6 (compare FIGS. 5 and 6).

Figure 6:
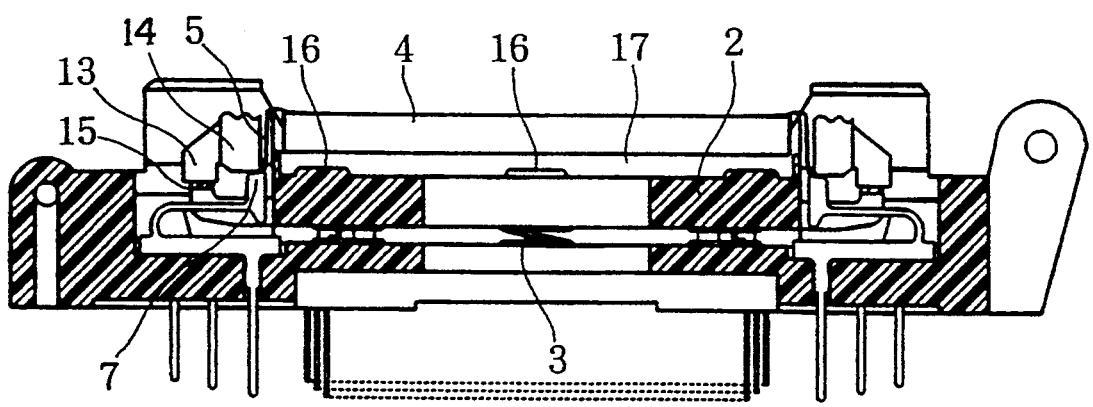
FIG. 6 is a sectional view of the IC socket of FIG. 5, but with the IC leads further pushed by a second presser portion.

Due to the above procedure, the IC leads 5 are held between the contacts 6 and the second presser portions 14 under pressure, and the contacting operation of the IC leads 5 with respect to the corresponding contacts 6 is finished. As shown in FIG. 6, in this contact-finished state, the IC body 4 floats very slightly above the projections 16 (that is, the IC body 4 is slightly spaced apart from the projections 16), and the IC body 4 with the IC leads 5 held between the contacts 6 and the second presser portions 14 is supported above the projections 16.

As described in the foregoing, when the position of the IC lead at one end of the row (e.g. 5') is corrected by the inclined wall surface 21, the IC body 4 placed on the IC platform 2 slides on the projections 16 with a small amount of force, in response to the correcting force between the IC lead (e.g. 5') and the inclined wall surface 21. The IC lead at the end of the row (e.g. 5') can be guided smoothly along the inclined wall surface 21 to the vertical wall surface 22 without receiving an excessive load, so that the IC leads 5 are brought into correct alignment with the contacts 6. This effect is enhanced by the arrangement in which the IC is supported only by the projections 16, and the IC leads 5 are not supported on the marginal wall 20.

By virtue of the foregoing arrangement, possible deformation of the IC leads attributable to positional correction can be prevented satisfactorily. Furthermore, by allowing the lower surface of the IC body 4 to be supported on the projections 16, a favorable ventilation space or gap 17 can be formed between the upper surface of the IC platform 2 and the lower surface of the IC body 4. As a result, heat can be released in a favorable manner.

Due to the foregoing arrangement, the necessity of making the IC leads smaller and for arranging the IC leads at narrower pitches in a plug-in type IC socket can be effectively coped with, because even if the IC leads are made small, they can be brought into correct alignment with the corresponding contacts without being deformed.

What is claimed is:

1. An apparatus comprising:

a socket board having a plurality of contacts arranged in rows;

an IC platform vertically movably mounted on said socket board and adapted to support an IC having an IC body with a plurality of leads arranged in rows and projecting sidewardly therefrom so as to engage against said plurality of contacts, respectively;

wherein said socket board includes inclined wall surfaces at opposing ends of said rows of contacts, respectively, and vertical wall surfaces respectively extending downwardly from lower ends of said inclined wall surfaces, said inclined wall surfaces comprising means for guiding outermost leads of the rows of leads onto said vertical wall surfaces when the IC is moved downwardly onto said IC platform in order to position the rows of leads between respectively opposing ones of said vertical wall surfaces and align the leads with said contacts, respectively;

wherein a marginal wall projects upwardly from a periphery of said IC platform; and wherein a plurality of projections project upwardly from an upper surface of said IC platform and constitute a means for supporting the IC body such that a lower surface thereof is spaced above the upper surface of said IC platform, a gap is formed between said marginal wall and side walls of the IC body, and the leads of the IC are spaced above a top of said marginal wall, said projections being spaced apart from one another and being spaced inwardly from said marginal wall so as to further constitute a ventilation means for allowing air to flow from the space formed between said upper surface of said IC platform and the lower surface of the IC body, between said projections, and upwardly through the gap formed between said marginal wall and the side walls of the IC body.

2. An apparatus as recited in claim 1, wherein said IC platform is substantially rectangular so as to have four sides; and each of said projections projects upwardly from said upper surface of said IC platform at a location spaced inwardly from a periphery of said IC platform and at an intermediate position of one of said four sides.

3. An apparatus as recited in claim 2, wherein each of said projections is substantially circular in horizontal cross section.

4. An apparatus comprising:

a socket board having a plurality of contacts arranged in rows;

an IC platform vertically movably mounted on said socket board;

an IC adapted to be supported on said IC platform and having an IC body with a plurality of leads arranged in rows and projecting sidewardly therefrom for engaging against said plurality of contacts, respectively;

wherein said socket board includes inclined wall surfaces at opposing ends of said rows of contacts, respectively, and vertical wall surfaces respectively extending downwardly from lower ends of said inclined wall surfaces, said inclined wall surfaces comprising means for guiding outermost leads of said rows of leads onto said vertical wall surfaces when said IC is moved downwardly onto said IC platform in order to position said rows of leads between respectively opposing ones of said vertical wall surfaces and align said leads with said contacts, respectively;

wherein a marginal wall projects upwardly from a periphery of said IC platform; and wherein a plurality of projections project upwardly from an upper surface of said IC platform and constitute a means for supporting said IC body such that a lower surface thereof is spaced above the upper surface of said IC platform, a gap is formed between said marginal wall and side walls of said IC body, and said leads of said IC are spaced above a top of said marginal wall, said projections being spaced apart from one another and being spaced inwardly from said marginal wall so as to further constitute a ventilation means for allowing air to flow from the space formed between said upper surface of said IC platform and the lower surface of said IC body, between said projections, and upwardly through said gap formed between said marginal wall and said side walls of said IC body.

5. An apparatus as recited in claim 4, wherein said IC platform is substantially rectangular so as to have four sides; and each of said projections projects upwardly from said upper surface of said IC platform at a location spaced inwardly from a periphery of said IC platform and at an intermediate position of one of said four sides.

6. An apparatus as recited in claim 5, wherein each of said projections is substantially circular in horizontal cross section.

* * * * *